US008970051B2

(12) United States Patent
Shi et al.

(10) Patent No.: US 8,970,051 B2
(45) Date of Patent: Mar. 3, 2015

(54) SOLUTION TO DEAL WITH DIE WARPAGE DURING 3D DIE-TO-DIE STACKING

(71) Applicants: Hualiang Shi, Chandler, AZ (US); Shengquan E. Ou, Chandler, AZ (US); Sairam Agraharam, Chandler, AZ (US); Tyler N. Osborn, Gilbert, AZ (US)

(72) Inventors: Hualiang Shi, Chandler, AZ (US); Shengquan E. Ou, Chandler, AZ (US); Sairam Agraharam, Chandler, AZ (US); Tyler N. Osborn, Gilbert, AZ (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 13/930,889

(22) Filed: Jun. 28, 2013

(65) Prior Publication Data

US 2015/0001740 A1 Jan. 1, 2015

(51) Int. Cl.
*H01L 23/52* (2006.01)
*H01L 23/48* (2006.01)
*H01L 23/02* (2006.01)
*H01L 23/488* (2006.01)
*H01L 21/44* (2006.01)
*H01L 21/50* (2006.01)
*H01L 21/768* (2006.01)
*H01L 23/498* (2006.01)

(52) U.S. Cl.
CPC ............ *H01L 21/768* (2013.01); *H01L 23/498* (2013.01)
USPC .... 257/777; 257/686; 257/779; 257/E25.027; 257/E23.023; 438/612; 438/108

(58) Field of Classification Search
CPC ............................ H01L 21/768; H01L 23/498
USPC .......... 257/777, 686, 779, E25.027, E23.023; 438/612, 108
See application file for complete search history.

(56) References Cited

U.S. PATENT DOCUMENTS

| | | | |
|---|---|---|---|
| 4,581,680 A * | 4/1986 | Garner .......................... | 361/768 |
| 5,641,946 A * | 6/1997 | Shim .............................. | 174/261 |
| 6,107,685 A * | 8/2000 | Nishiyama .................... | 257/737 |
| 6,443,351 B1 * | 9/2002 | Huang et al. .................. | 228/103 |
| 6,534,875 B1 * | 3/2003 | Nishiyama .................... | 257/778 |
| 6,940,176 B2 * | 9/2005 | Chen ............................. | 257/778 |
| 7,084,500 B2 * | 8/2006 | Swnson et al. ................ | 257/738 |
| 7,091,619 B2 * | 8/2006 | Aoyagi .......................... | 257/777 |
| 7,714,437 B2 * | 5/2010 | Naya ............................. | 257/737 |
| 7,989,959 B1 * | 8/2011 | Rahman ........................ | 438/108 |
| 8,546,954 B2 * | 10/2013 | Kwon et al. .................. | 257/777 |
| 8,703,600 B2 * | 4/2014 | Migita et al. ................. | 438/613 |
| 2002/0068381 A1 * | 6/2002 | Ference et al. ................ | 438/108 |

* cited by examiner

*Primary Examiner* — Luan C Thai
(74) *Attorney, Agent, or Firm* — Blakely, Sokoloff, Taylor & Zafman LLP

(57) ABSTRACT

A method including forming a contact pad array on an integrated circuit substrate, the contact pad array including a first plurality of contact pads and a second plurality of contact pads, wherein an accessible area of each of the first plurality of contact pads is different than an accessible area of each of the second plurality of contact pads; and depositing solder on the accessible area of the contact pads. An apparatus including an integrated circuit substrate including a body having a nonplanar shape and a surface including a first plurality of contact pads and a second plurality of contact pads, wherein an accessible area of each of the first plurality of contact pads is different than an accessible area of each of the second plurality of contact pads.

18 Claims, 5 Drawing Sheets

SOLUTION TO DEAL WITH DIE WARPAGE DURING 3D DIE-TO-DIE STACKING

BACKGROUND

1. Field

Integrated circuit packaging.

2. Description of Related Art

In an effort to improve interconnect speed, decrease power consumption and reduce integrated circuit package form factor, three-dimensional packages with die-to-die stacking has been promoted.

Die-to-die stack minimizes the effort to place all technologies on to a single die. Instead, multiple dies may be stacked together. Such dies may allow a different fabrication technology optimized for a particular type of circuitry, such as memory, logic, analog and sensors. Wide I/O memory is a recent dynamic random access memory (DRAM) technology that contemplates a memory die stacked on a microprocessor die or vice versa. JEDEC standard JESD229, "Wide I/O Single Data Rate," December 2011, specifies four 128-bit channels, providing a 512-bit interface to DRAM. An interface between the dice involves, in one embodiment, solder connections.

In three-dimensional packaging, the assembly process flow depends on different variables, including package architecture (e.g., die size, substrate layout, etc.); fabrication materials and processes (e.g., silicon, back end of line (BEOL) metallization, die back side metallization, nitride stress); assembly materials and processes; and costs. The shape/topography of a chip during assembly is complex. Depending on the process flow variables, the chip or die shape can be concave, convex, saddle or other shape. During die-to-die bonding, the shape of one or both dies can effect the contact between the die dice and incompatible shapes can induce non-contact open, stretch solder joints and other defects that can induce process yield loss and reliability degradation.

DETAILED DESCRIPTION

In an effort to improve the interconnect speed, decrease power consumption and reduce a package form factor, three-dimensional packages with die-to-die stacking are presented as approaches for alleviating the risk of non-contact open and/or stretched solder joints.

Figure 1:
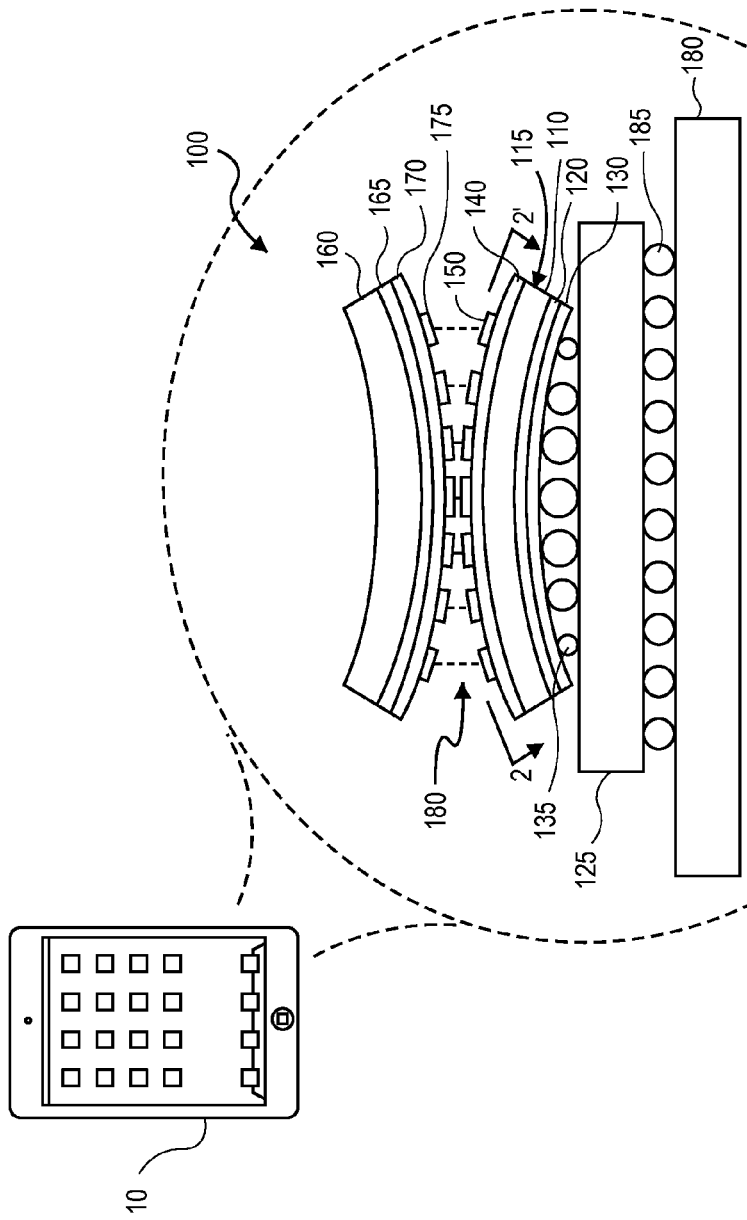
FIG. 1 shows a cross-sectional side view of a portion of an assembly that is suitable for use in a computing device.

FIG. 1 shows a cross-sectional side view of a portion of an assembly that is suitable for use in a computing device (computing device 10) including, but not limited to, a desktop computer, or a handheld device (e.g., a tablet, a smart phone, etc.). Assembly 100 includes die 110 that is, for example, a processor including device layer 120 and metallization 130. Die 110, in this embodiment, is connected to package 125 through, for example, solder ball interconnections 135 having a diameter on the order of, for example, 100 microns and a pitch on the order of 100 microns. A superior surface of die 110 (as viewed) includes metallization layer 140 terminating in a number of contact pads 150 for a connection to a secondary device. Thus, in one embodiment, die 110 includes through silicon vias (TSVs) for a connection to a secondary die in a surface to surface orientation. Overlying die 110, in this embodiment, is secondary die 160. Secondary die 160 is, for example, a memory die (e.g., DRAM) including device layer 165 and metallization layer 170. Metallization layer 170 is terminated by a number of contact points or pads 175 or connection to contact points or pads 150 of die 110. A connection between die 110 and die 160 is made, in one embodiment, through solder connections between aligned contact points or pads 150 (die 110) and contact points or pads 175 (die 160). The connections are illustrated as dashed lines in FIG. 1. FIG. 1 also shows package 125 connected to printed circuit board 180 (e.g., a motherboard) through, for example, solder connections 185. Representatively, the configuration of die 110 and secondary die complies with JEDEC standard JESD229 in implementing wide I/O.

As noted above, one issue facing die-to-die stacking is the shape of a primary die (die 110) and a secondary die (die 160) and a desire for reliable connections between the dice. As illustrated in FIG. 1, due, in one aspect, to the processing of the individual dice, each die may have a non-planar shape and adopt, for example, a concave, convex, saddle or other shape relative to planar surface. FIG. 1 shows die 110 having a generally convex shape and die 160 having a generally concave shape relating to a planar surface (e.g., representatively, a planar surface is illustrated as a surface of printed circuit board 180).

Figure 2:
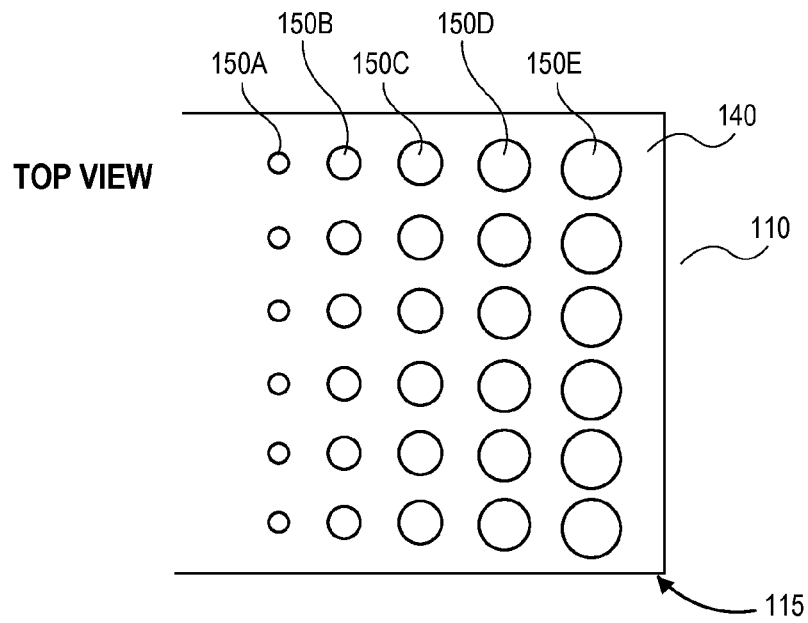
FIG. 2 shows a top view of a portion of a die through line 2-2' of FIG. 1.
Figure 3:
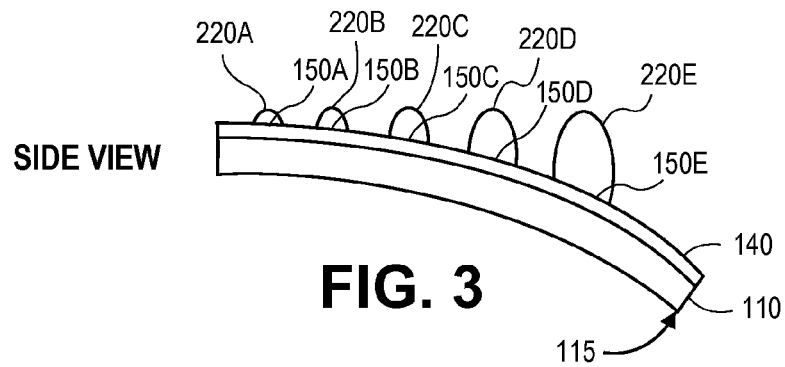
FIG. 3 shows a side view of a portion die as shown in FIG. 2.
Figure 4:
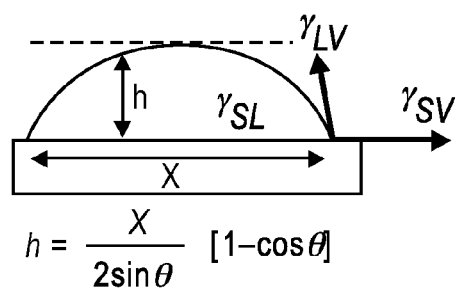
FIG. 4 shows solder material on a contact pad.

FIGS. 2-4 illustrate one approach to improve die-to-die connection in three-dimensional packaging. FIG. 2 shows a top view of a portion of die 110 through line 2-2' of FIG. 1. As illustrated in FIG. 1, in this embodiment, die 110 has a generally convex shape while die 160 has a generally concave shape. Accordingly, in one embodiment, contact points or pads in or on a surface of die 110 are arranged in columns (as viewed) of points or pads of different sizes. FIG. 2 illustrates contact points or pads 150A, 150B, 150C, 150D and 150E extending left to right in a row toward edge 115 of die 110 with each numerical designation representing a column of contact points or pads of similar size. Where die 110 has a generally convex shape relative to a planar surface, contact points or pads closer to edge 115 of die 110 will tend to be further away from contact points or pads of a secondary die (e.g., contact points or pads 175 of die 160, FIG. 1) than contact points or pads further away from edge 115 (e.g., closer toward the center of die 110). Thus, in one embodiment, contact points or pads 150E have a larger diameter (and a larger accessible area) than contact points of pads 150A-150D. Contact points or pads 150A are illustrated with the smallest diameter (smallest accessible area) and the diameter (accessible area) gets progressively larger with each column of contact points or pads (points or pads 150B-150E) as edge 115 approached. Contact points or pads 150A-150E are illustrated in this embodiment as circular. In other embodiments, the contact points or pads may have other shapes, including but not limited to, rectangular, square and oval shapes.

Contact points or pads 150A-150E can be formed according to conventional techniques. Representatively, contact points may be formed by introducing a conductive seed layer; disposing a mask on the conductive seed layer in areas where contact points or pads are not desired; electroplating a material such as copper or a copper alloy to form the contact points or pads. The mask and undesired seed material may then be removed by etching. According to this method, openings in a masking layer can determine the accessible area of the contact points or pads. Representatively, a masking layer may be introduced and patterned to have openings of different diameter for column of contacts shown in FIG. 2 (contact points or pads 150A-150E). Alternatively, each of contact points or pads 150A-150E may be formed of a similar diameter (similar accessible area) and, after forming the contact points or pads, a dielectric material, such as WPR, commercially available from JSP Micro, Inc. of Sunnyvale, Calif., may be introduced, such as introduced through a patterned mask, on portions of ones of the contact points or pads to reduce the accessible area of the contact points or pads.

FIG. 3 shows a side view of the portion die 110 as shown in FIG. 2, following the introduction of solder material on the contact points or pads. In one embodiment, wave solder deposition is used to deposit solder on contact points or pads 150A-150E. As indicated in FIG. 4, a height of an amount (volume) of solder transferred post wave solder deposition is proportional to a contact point or pad diameter. Since contact points or pads 150E have an accessible area greater than contact points or pads 150A-150D, a height, h, of solder material is greater on contact points or pads 150E than on any of contact points or pads 150A-150D; a height of solder material on contact points or pads 150D is greater than a height of any of contact points or pads 150A-150C; a height of solder material on contact points or pads 150C is greater than a height of any of contact points or pads 150A-150B; and height of solder material on contact points or pads 150B is greater than a height of any of contact points or pads 150A.

FIG. 3 shows solder material 220A of, for example, a tin-based solder introduced on contact points or pads 150A-150E. Specifically, FIG. 3 shows solder material 220A on contact points or pads 150A; solder material 220B on contact points or pads 150B; solder material 220C on contact points or pads 150C; solder material 220D on contact points or pads 150D; and solder material 220E on contact points or pads 150E. As illustrated, the amount of solder material 220E on contact points or pads 150E is greater than an amount of solder material on any of contact points or pads 150A-150D. Accordingly, a height, h, of solder material 220E is greater than a height of solder material on any of contact points or pads 150A-150D. The greater height tends to reduce the effective solder material/pads co-planarity/flatness for a convex-shaped die, alleviating issue associated with die warpage (e.g., non-contact opens). It is appreciated that for different die shapes (e.g., concave, convex, saddle), a diameter of contact points or pads can be modified. For instance, where a shape or die 110 is concave, contact points or pads 150A could have a greater accessible area (e.g., greater diameter) than contact points or pads 150E.

Figure 5:
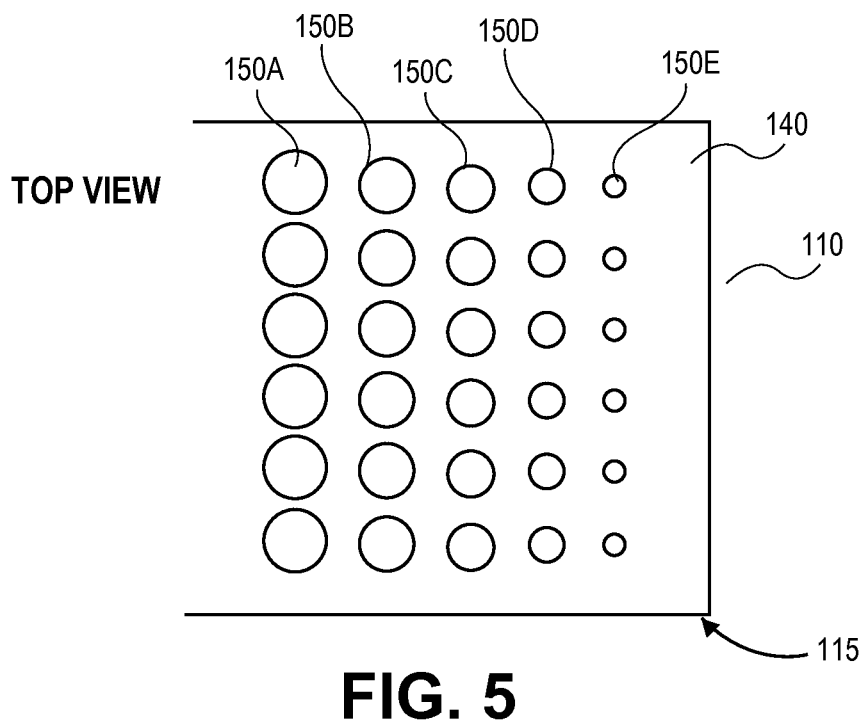
FIG. 5 shows a top view of a portion of a die through line 2-2' of FIG. 1.
Figure 6:
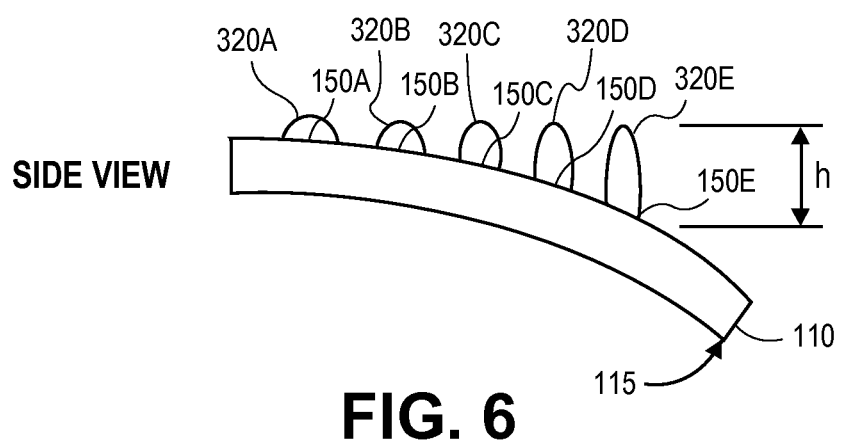
FIG. 6 shows a side view of the structure of FIG. 5 following the introduction of solder material.

FIGS. 5-6 describe a second approach to address potential problems associated with non-planar dies in three-dimensional packaging arrangements. FIG. 5 shows a top view of a portion of die 110 through line 2-2' of FIG. 1. The portion is close to edge 115. As illustrated, in this embodiment, die 110 includes a number of contact points or pads 150A-150E. Where die 110 has a convex shape and die 160 has a concave shape such as illustrated in FIG. 1, contact points or pads 150A-150E are progressively reduced in diameter going from left to right as viewed toward edge 115 of die 110. Accordingly, contact points or pads 150E have a smaller diameter than contact points or pads 150A.

FIG. 6 shows a side view of the structure of FIG. 5 following the introduction of solder material. In this embodiment, solder material of the same amount (same volume) is deposited on each of the contact points or pads (each of contact points or pads 150A-150E). The solder material is introduced and reflowed. Due to the difference in diameter of the contact points or pads, the smaller diameter contact pads (e.g., contact points or pads 150D, contact points or pads 150E) and the same solder material amounts (volumes) on each of the contact points or pads, the solder material on the smaller diameter contact points or pads will tend to be taller than those of the larger diameter contact points or pads. As illustrated in FIG. 6, solder material 320A is reflowed on contact points or pads 150A; solder material 320B is reflowed on contact points or pads 150B; solder material 320C is reflowed on contact points or pads 150C; solder material 320D is reflowed on contact points or pads 150D; solder material 320E is reflowed on contact points or pads 150E. As illustrated, the height, h, of solder material 320E on contact points or pads 150E is taller than a height of solder material 320D on contact points or pads 150D; a height of solder material 320D on contact points or pads 150D are greater than solder material 320C on contact points or pads 150C; a height of solder material 320C on contact points or pads 150C is greater than solder material 320B on contact points or pads 150B; and a height of solder material 320B on contact points or pads 150B is greater than solder material 320A on contact points or pads 150A. The difference in heights can reduce the effective solder material/pad/coplanarity/flatness alleviating issues related to die warpage.

Contact points or pads 150A-150E in FIGS. 5-6 may be formed as described above with reference to FIGS. 2-3 of different diameters. In one embodiment, an accessible area of a contact point or pad may be controlled by a dielectric material placed or introduced around the contact points or pads. Thus, for example, in one embodiment, the contact points or pads of die 110 may have a similar diameter (similar area) and a dielectric material may be introduced on die 110 where the dielectric material covers a portion of the contact points or pads reducing the accessible area of the contact points or pads for solder introduction.

Figure 7:
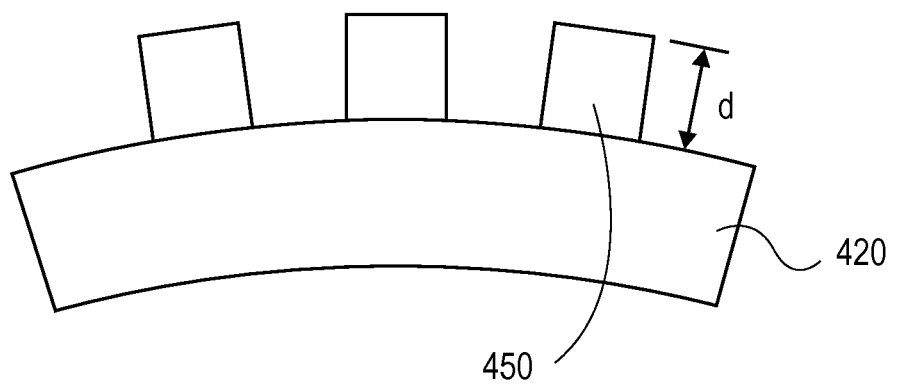
FIG. 7 shows a cross-sectional side view of a portion of a die having three-dimensional contact pads in accordance with another embodiment.

In the above embodiments, reference to an accessible area was described with respect to a two-dimensional contact points or pads (contact points or pad on a surface of a substrate). In another embodiment, contact points may extend a distance from a surface of a substrate. FIG. 7 shows an example of a three-dimensional contact pad. FIG. 7 is a side view of a portion of integrated circuit substrate 420 and illustrates contact pad 450 extending from a surface of substrate 420. Representatively, contact pad 450 extends a distance, d, of 10 μm to 20 μm from a surface of substrate 420. By extending from a surface of substrate 420, an area of contact pad 450 includes a top surface of pad 450 (as viewed) as well as the sidewall surface(s) of the pad. The accessible area of the sidewalls of contact pad 450 that may be contacted by a solder material may include the entire area (including the top surface and the area attributable to the sidewalls surface(s) or some portion less than an entire area where, for example, dielectric material is present around a portion of the sidewall surface(s) (including the entire sidewall surface(s)).

Figure 8:
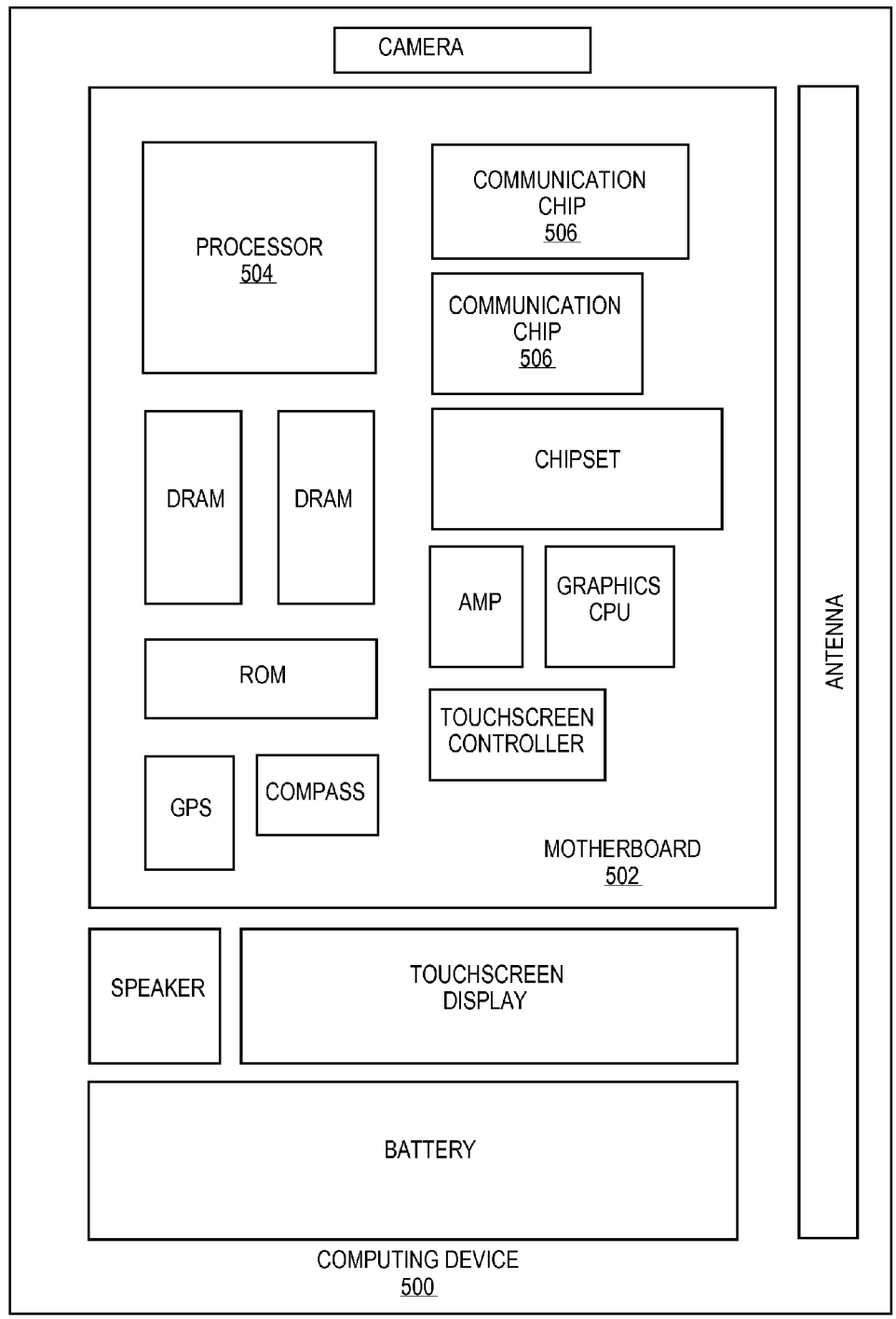
FIG. 8 illustrates a computing device in accordance with one implementation.

FIG. 8 illustrates a computing device 500 in accordance with one implementation. The computing device 500 houses board 502. Board 502 may include a number of components, including but not limited to processor 504 and at least one communication chip 506. Processor 504 is physically and electrically connected to board 502. In some implementations the at least one communication chip 506 is also physically and electrically connected to board 502. In further implementations, communication chip 506 is part of processor 504.

Depending on its applications, computing device 500 may include other components that may or may not be physically and electrically connected to board 502. These other components include, but are not limited to, volatile memory (e.g., DRAM), non-volatile memory (e.g., ROM), flash memory, a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth).

Communication chip 506 enables wireless communications for the transfer of data to and from computing device 500. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. Communication chip 806 may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. Computing device 500 may include a plurality of communication chips 506. For instance, a first communication chip 506 may be dedicated to shorter range wireless communications such as Wi-Fi and Bluetooth and a second communication chip 806 may be dedicated to longer range wireless communications such as GPS, EDGE, GPRS, CDMA, WiMAX, LTE, Ev-DO, and others.

Processor 504 of computing device 500 includes an integrated circuit die packaged within processor 504. In some implementations, the package is formed in accordance with embodiments described above utilizes. The term "processor" may refer to any device or portion of a device that processes electronic data from registers and/or memory to transform that electronic data into other electronic data that may be stored in registers and/or memory.

Communication chip 506 also includes an integrated circuit die packaged within communication chip 506. In further implementations, another component housed within computing device 500 may contain a microelectronic package.

In various implementations, computing device 500 may be a laptop, a netbook, a notebook, an ultrabook, a smartphone, a tablet, a personal digital assistant (PDA), an ultra mobile PC, a mobile phone, a desktop computer, a server, a printer, a scanner, a monitor, a set-top box, an entertainment control unit, a digital camera, a portable music player, or a digital video recorder. In further implementations, computing device 500 may be any other electronic device that processes data.

In the description above, for the purposes of explanation, numerous specific details have been set forth in order to provide a thorough understanding of the embodiments. It will be apparent however, to one skilled in the art, that one or more other embodiments may be practiced without some of these specific details. The particular embodiments described are not provided to limit the invention but to illustrate it. The scope of the invention is not to be determined by the specific examples provided above but only by the claims below. In other instances, well-known structures, devices, and operations have been shown in block diagram form or without detail in order to avoid obscuring the understanding of the description. Where considered appropriate, reference numerals or terminal portions of reference numerals have been repeated among the figures to indicate corresponding or analogous elements, which may optionally have similar characteristics.

It should also be appreciated that reference throughout this specification to "one embodiment", "an embodiment", "one or more embodiments", or "different embodiments", for example, means that a particular feature may be included in the practice of the invention. Similarly, it should be appreciated that in the description various features are sometimes grouped together in a single embodiment, figure, or description thereof for the purpose of streamlining the disclosure and aiding in the understanding of various inventive aspects. This method of disclosure, however, is not to be interpreted as reflecting an intention that the invention requires more features than are expressly recited in each claim. Rather, as the following claims reflect, inventive aspects may lie in less than all features of a single disclosed embodiment. Thus, the claims following the Detailed Description are hereby expressly incorporated into this Detailed Description, with each claim standing on its own as a separate embodiment of the invention.

What is claimed is:

1. A method comprising:
   forming a contact pad array on an integrated circuit substrate, the contact pad array comprising a first plurality of contact pads disposed on a first area of the substrate and a second plurality of contact pads disposed on a second area of the substrate, wherein a shape of the integrated circuit substrate is at least one of a convex shape or a concave shape relative to a planar surface and an accessible area of each of the first plurality of contact pads is different than an accessible area of each of the second plurality of contact pads and the accessible area is defined by a top surface and a sidewall surface; and
   depositing solder on the accessible area of the contact pads.

2. The method of claim 1, wherein the accessible area of the contact pads is defined by an area of the contact pads.

3. The method of claim 1, wherein depositing solder comprises depositing an equivalent volume of solder on each of the first plurality of contact pads and the second plurality of contact pads.

4. The method of claim 1, wherein depositing solder comprises depositing a first volume of solder on each of the first plurality of contact pads and a different second volume of solder on each of the second plurality of contact pads.

5. The method of claim 1, wherein in the integrated circuit substrate is a first integrated circuit substrate, the method further comprising coupling a second integrated circuit substrate to the first integrated circuit substrate through the deposited solder.

6. An apparatus comprising:
   an integrated circuit substrate comprising a body having at least one of a convex shape and a concave shape relative to a planar surface and a surface comprising a first plurality of contact pads disposed on a first area of the substrate and a second plurality of contact pads disposed on a second area of the substrate, wherein an accessible area of each of the first plurality of contact pads is different than an accessible area of each of the second plurality of contact pads and the first area is disposed at a height dimension relative to planar that is different than a height dimension relative to planar to which the second area is disposed, and the accessible area is defined by a top surface and a sidewall surface.

7. The apparatus of claim 6, wherein the accessible area of the contact pads is defined by an area of the contact pads.

8. The apparatus of claim 6, further comprising a volume of solder on each of the first plurality of contact pads and the second plurality of contact pads, wherein a volume of solder on each of the first plurality of contact pads is equivalent to a volume of solder on each of the second plurality of contact pads.

9. The apparatus of claim 6, further comprising a volume of solder on each of the first plurality of contact pads and the second plurality of contact pads, wherein a volume of solder on each of the first plurality of contact pads is different than a volume of solder on each of the second plurality of contact pads.

10. The apparatus of claim 6, wherein the integrated circuit substrate comprises a first integrated circuit substrate and the apparatus further comprises second integrated circuit substrate comprising a plurality of contact points, respective ones of the plurality of contact points coupled through a volume of solder to the accessible area of ones of the first plurality of contact pads and the second plurality of contact pads such that the first integrated circuit substrate and the second integrated circuit substrate are arranged in a surface to surface orientation.

11. The apparatus of claim 10, wherein the second area of the first integrated substrate is at a distance from the second integrated circuit substrate that is greater than a distance between the first area of the first integrated substrate and the second integrated circuit substrate.

12. The apparatus of claim 10, further comprising a package substrate, wherein the first integrated circuit substrate is coupled to the package substrate.

13. An apparatus comprising:
a first integrated circuit substrate having at least one of a convex shape and a concave shape relative to a planar surface, the first integrated circuit comprising a first plurality of contact pads disposed on a first area of the substrate and a second plurality of contact pads disposed on a second area of the substrate, wherein an accessible area of each of the first plurality of contact pads is different than an accessible area of each of the second plurality of contact pads and the accessible area is defined by a top surface and a sidewall surface; and
a second integrated circuit substrate comprising a plurality of contact points, respective ones of the plurality of contact points coupled through a volume of solder to the accessible area of ones of the first plurality of contact pads and the second plurality of contact pads such that the first integrated circuit substrate and the second integrated circuit are arranged in a surface to surface orientation.

14. The apparatus of claim 13, wherein the accessible area of the contact pads is defined by an area of the contact pads.

15. The apparatus of claim 13, further comprising a volume of solder on each of the first plurality of contact pads and the second plurality of contact pads, wherein a volume of solder on each of the first plurality of contact pads is equivalent to a volume of solder on each of the second plurality of contact pads.

16. The apparatus of claim 13, further comprising a volume of solder on each of the first plurality of contact pads and the second plurality of contact pads, wherein a volume of solder on each of the first plurality of contact pads is different than a volume of solder on each of the second plurality of contact pads.

17. The apparatus of claim 13, wherein the second area of the first integrated substrate is at a distance from the second integrated circuit substrate that is greater than a distance between the first area of the first integrated substrate and the second integrated circuit substrate.

18. The apparatus of claim 13, further comprising a package substrate, wherein the first integrated circuit substrate is coupled to the package substrate.

* * * * *